(12) United States Patent
Kendzia, III et al.

(10) Patent No.: US 12,176,701 B2
(45) Date of Patent: Dec. 24, 2024

(54) GROUND FAULT PROTECTION IN A HIGH RESISTANCE GROUNDING SYSTEM

(71) Applicant: ABB Schweiz AG, Baden (CH)

(72) Inventors: Thomas Anthony Kendzia, III, Richmond, VA (US); Veerakumar Bose, Richmond, VA (US); Liju Kallarackal, Richmond, VA (US)

(73) Assignee: ABB SCHWEIZ AG, Baden (CH)

( * ) Notice: Subject to any disclaimer, the term of this patent is extended or adjusted under 35 U.S.C. 154(b) by 216 days.

(21) Appl. No.: 18/057,193

(22) Filed: Nov. 18, 2022

(65) Prior Publication Data
US 2024/0170944 A1    May 23, 2024

(51) Int. Cl.
H02H 3/16    (2006.01)
H02H 1/00    (2006.01)

(52) U.S. Cl.
CPC ............ H02H 3/16 (2013.01); H02H 1/0007 (2013.01)

(58) Field of Classification Search
CPC ............ H02H 3/16; H02H 1/007; H02H 1/00; H02H 7/26; H02H 3/042; H02H 3/162; G01R 31/08; G01R 31/02; G01R 31/52
USPC ..................................................... 361/42–50
See application file for complete search history.

(56) References Cited

U.S. PATENT DOCUMENTS

| 4,866,507 | A | 9/1989 | Jabobs et al. |
|---|---|---|---|
| 5,304,843 | A | 4/1994 | Takubo et al. |
| 6,023,209 | A | 2/2000 | Faulkner et al. |
| 6,211,576 | B1 | 4/2001 | Shimizu et al. |
| 6,215,175 | B1 | 4/2001 | Kinsman |
| 6,218,731 | B1 | 4/2001 | Huang et al. |
| 6,278,616 | B1 | 8/2001 | Gelsomini et al. |
| 6,300,165 | B2 | 10/2001 | Castro |
| 6,373,131 | B1 | 4/2002 | Karnezos |
| 6,376,904 | B1 | 4/2002 | Haba et al. |
| 6,545,366 | B2 | 4/2003 | Michii et al. |
| 6,549,413 | B2 | 4/2003 | Karnezos et al. |
| 6,608,389 | B1 | 8/2003 | Hashimoto |
| 11,362,507 | B2 | 6/2022 | Kendzia, III et al. |
| 2001/0009782 | A1 | 7/2001 | Ball et al. |
| 2001/0033015 | A1 | 10/2001 | Corisis |
| 2001/0038141 | A1 | 11/2001 | Wensel |

(Continued)

FOREIGN PATENT DOCUMENTS

| DE | 41 15 421 A1 | 11/1991 |
|---|---|---|
| DE | 101 33 571 A1 | 1/2003 |
| WO | 2022106900 A2 | 5/2022 |

Primary Examiner — Danny Nguyen
(74) Attorney, Agent, or Firm — Greenberg Traurig, LLP

(57) ABSTRACT

A ground fault protection system includes a power switch including a source-side and a load-side. The power switch is structured to receive a load current from a power source at the source-side and selectively output the load current from the load-side to a load. A first voltage measuring device is structured to measure a first voltage of the source-side while the power switch is not conducting the load current. A second voltage measuring device is structured to measure a second voltage of the load-side while the power switch is not conducting the load current. A controller is structured to determine a source-side-to-ground voltage based on the first voltage, determine a load-side-to-ground voltage based on the second voltage, determine a ground fault is occurring, and determine a direction of the ground fault relative to the power switch.

20 Claims, 4 Drawing Sheets

(56) References Cited

U.S. PATENT DOCUMENTS

| | | |
|---|---|---|
| 2002/0042160 A1 | 4/2002 | Brooks et al. |
| 2002/0093804 A1 | 7/2002 | Shoenborn |
| 2002/0100960 A1 | 8/2002 | Chang et al. |
| 2002/0175422 A1 | 11/2002 | Akram et al. |
| 2003/0030151 A1 | 2/2003 | Morozumi |
| 2015/0097571 A1* | 4/2015 | Wei ................... G01R 31/086 |
| | | 324/531 |
| 2024/0183911 A1* | 6/2024 | Tanaka ................... H02H 3/26 |

* cited by examiner

GROUND FAULT PROTECTION IN A HIGH RESISTANCE GROUNDING SYSTEM

FIELD

The present disclosure relates to the field of ground fault detection.

BACKGROUND

High resistance grounding (HRG) power systems include a resistor inserted between a ground and a neutral point that is structured to limit ground fault current to a magnitude that will not damage connected loads. To detect a ground fault, conventional methods include turning switching devices of the HRG power system on and off to trace the ground fault; injecting a traceable signal into the HRG power system and manually tracing the ground fault with a portable ammeter; or measuring system currents using current sensors.

SUMMARY

In some embodiments, a ground fault protection system includes a power switch including a source-side and a load-side. In some embodiments, the power switch is structured to receive a load current from a power source at the source-side and selectively output the load current from the load-side to a load. In some embodiments, a first voltage measuring device is structured to measure a first voltage of the source-side while the power switch is not conducting the load current. In some embodiments, a second voltage measuring device is structured to measure a second voltage of the load-side while the power switch is not conducting the load current. In some embodiments, a controller is structured to determine a source-side-to-ground voltage based on the first voltage, determine a load-side-to-ground voltage based on the second voltage, determine a ground fault is occurring, and determine a direction of the ground fault relative to the power switch. In some embodiments, the controller determines whether to mitigate the ground fault based on the direction of the ground fault by locking open the power switch in response to the controller determining two ground faults are occurring on different phases.

In some embodiments, the ground fault protection system is incorporated into a power system including a high resistance ground resistor.

In some embodiments, the power switch is structured to receive multiphase power at the source-side and output the multiphase power at the load-side.

In some embodiments, the controller determines a ground fault is occurring based on a voltage difference between ground and a neutral point of the multiphase power.

In some embodiments, the source-side includes a source-side terminal and the load-side includes a load-side terminal, and wherein the first voltage is measured at the source-side terminal and the second voltage is measured at the load-side terminal.

In some embodiments, the power switch is configured to receive multiphase power at the source-side and at the load-side.

In some embodiments, the power switch is coupled to a microgrid including the load and a distributed energy resource, and wherein the controller locks open the power switch in response to determining the ground fault direction is towards the power source.

In some embodiments, the controller determines whether to mitigate the ground fault based on the direction of the ground fault by closing the power switch in response to a ground fault not occurring.

In some embodiments, the controller determines whether to mitigate the ground fault based on the direction of the ground fault by locking open the power switch in response to a single ground fault occurring.

In some embodiments, the controller determines whether to mitigate the ground fault based on the direction of the ground fault by closing the power switch in response to the controller determining two ground faults are occurring on the same phase.

In some embodiments, a ground fault protection method includes measuring a first voltage of a source-side while a power switch is in an off state. In some embodiments, the method includes measuring a second voltage of a load-side while the power switch is in the off state. In some embodiments, the method includes determining a ground fault is occurring based on the first voltage and the second voltage. In some embodiments, the method includes determining a direction of the ground fault relative to the power switch. In some embodiments, the method includes determining, by a controller, whether to mitigate the ground fault based on the direction of the ground fault by locking open the power switch in response to the controller determining two ground faults are occurring on different phases.

In some embodiments, the power switch is incorporated into a high resistance ground system.

In some embodiments, the power switch is structured to receive multiphase power at the source-side and output the multiphase power at the load-side.

In some embodiments, determining the ground fault is occurring is based on a voltage difference between ground and a neutral point of the multiphase power.

In some embodiments, the source-side includes a source-side terminal and the load-side includes a load-side terminal, and wherein the first voltage is measured at the source-side terminal and the second voltage is measured at the load-side terminal.

In some embodiments, determining, by the controller, whether to mitigate the ground fault is based on the direction of the ground fault by closing the power switch in response to the controller determining a ground fault is not occurring.

In some embodiments, determining, by the controller, whether to mitigate the ground fault is based on the direction of the ground fault by locking open the power switch in response to a single ground fault occurring.

In some embodiments, determining, by the controller, whether to mitigate the ground fault is based on the direction of the ground fault by closing the power switch in response to the controller determining two ground faults are occurring on the same phase.

In some embodiments, the power switch is coupled to a microgrid including the load and a distributed energy resource, and wherein the method comprises opening the power switch in response to determining the ground fault direction is towards the power source.

In some embodiments, the power switch is configured to receive multiphase power at the source-side and at the load-side.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
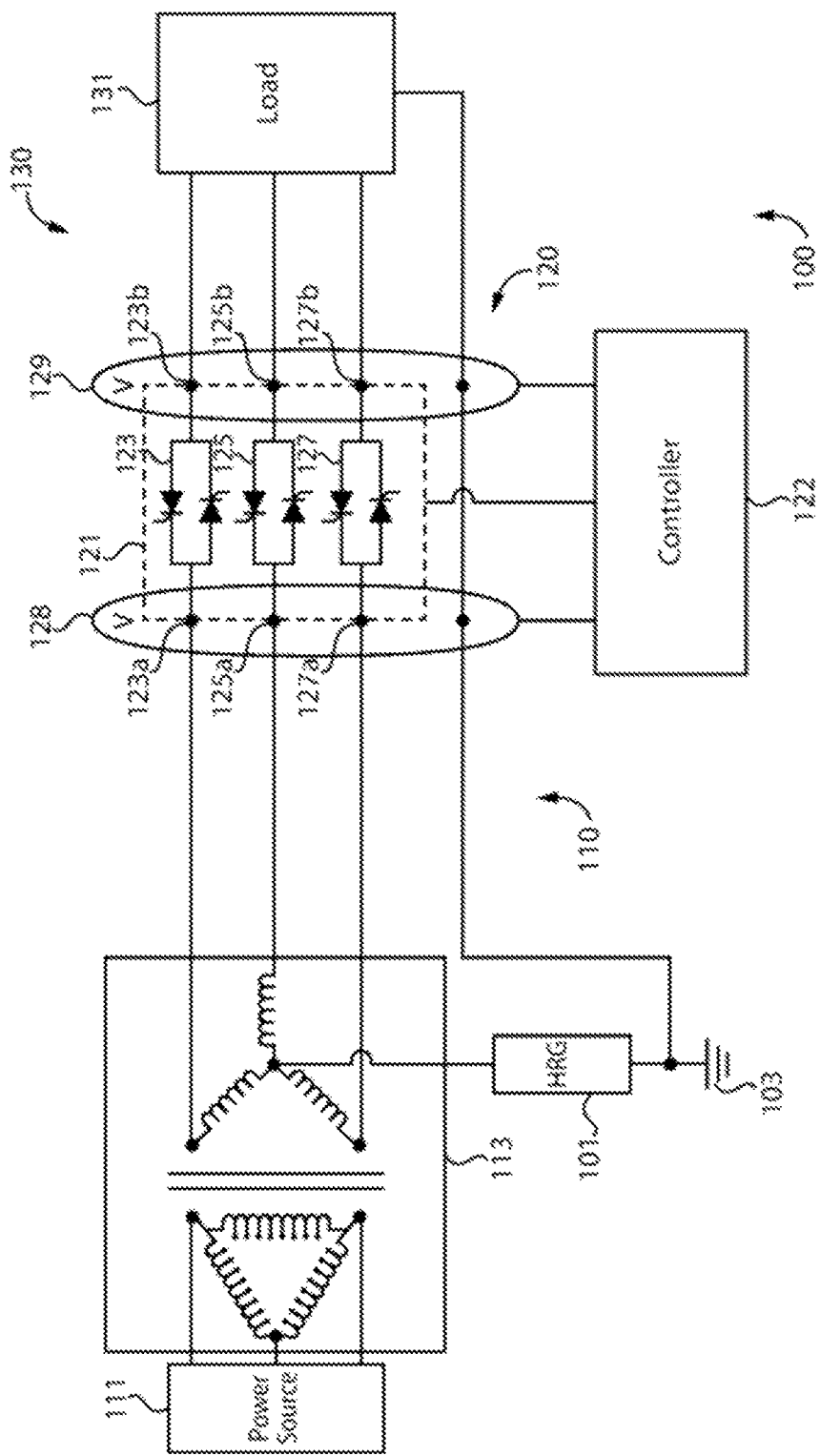
FIG. 1 is a circuit diagram illustrating an exemplary power system including a ground fault protection system.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

All prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "between" does not necessarily require being disposed directly next to other elements. Generally, this term means a configuration where something is sandwiched by two or more other things. At the same time, the term "between" can describe something that is directly next to two opposing things. Accordingly, in any one or more of the embodiments disclosed herein, a particular structural component being disposed between two other structural elements can be:

disposed directly between both of the two other structural elements such that the particular structural component is in direct contact with both of the two other structural elements;

disposed directly next to only one of the two other structural elements such that the particular structural component is in direct contact with only one of the two other structural elements;

disposed indirectly next to only one of the two other structural elements such that the particular structural component is not in direct contact with only one of the two other structural elements, and there is another element which juxtaposes the particular structural component and the one of the two other structural elements;

disposed indirectly between both of the two other structural elements such that the particular structural component is not in direct contact with both of the two other structural elements, and other features can be disposed therebetween; or any combination(s) thereof.

As used herein "embedded" means that a first material is distributed throughout a second material.

Existing ground fault protection systems suffer from a number of shortcomings and disadvantages. There remain unmet needs including reducing fault detection time, reducing hardware complexity, and reducing load interruption. For instance, manual tracing requires a significant amount of time, during which the non-ground-faulted phases of a system experience a 73% overvoltage, putting stress on power devices such as dielectric insulation. Furthermore, current sensors installed throughout an HRG power system are significantly more expensive and more susceptible for fault current saturation than other types of sensors, such as voltage measuring devices. In view of these and other shortcomings in the art, there is a significant need for the unique apparatuses, methods, systems and techniques disclosed herein.

With reference to FIG. 1, there is illustrated an exemplary high resistance grounding (HRG) power system 100 including a ground fault protection system 120, according to some embodiments. It shall be appreciated that ground fault protection system 120 may be implemented in a variety of applications, including transfer switches, microgrid disconnect switches, solid state circuit breakers, generator circuit breakers, power converters, marine vessel power distribution systems, vehicular distribution systems, and data center distribution systems, to name but a few examples. It shall be appreciated that the topology of power system 100 is illustrated for the purpose of explanation and is not intended as a limitation of the present disclosure.

In the illustrated embodiment, power system 100 is structured to provide three-phase power including a load current from power source 111 to load 131. The load current is the portion of the total nominal current received by load 131 while load 131 is operating. In other embodiments, power system 100 may be structured to provide DC power between power source 111 and load 131, or another type of AC power with a different number of phases, including a single-phase system.

HRG power system 100 includes a power network 110 and a power network 130 coupled together by way of ground fault protection system 120. Power network 110 includes power source 111 and a transformer 113. Power source 111 is coupled to a primary side of transformer 113 and ground fault protection system 120 is coupled to a secondary side of transformer 113. The primary side of transformer 113 is arranged in a delta configuration and the secondary side of transformer 113 is arranged in a wye configuration. Power source 111 may be any type of device or system structured to generate and output power.

HRG power system 100 includes a high resistance ground resistor 101 coupled between a neutral point of the wye configuration of the secondary side of transformer 113 and a ground 103. Resistor 101 is sized to allow system 100 to remain online while a ground fault occurs between one of the phase conductors of the power networks of system 100 and a grounded conductor or surface. Resistor 101 is also sized to limit ground fault current to a magnitude that will not damage components of system 100. For example, resistor 101 may be sized to limit the magnitude of the ground fault current to 5-10 A, to name but one example. It is to be appreciated that this is an example, and the actual magnitude of the ground fault current can vary beyond the stated range.

Power network 130 includes load 131 coupled to ground fault protection system 120. Load 131 may be any type of device or system structured to receive the power output by power source 111. In some embodiments, load 131 may be configured to provide a power output as well.

Ground fault protection system 120 includes a power switch 121, voltage measuring devices 128 and 129, and a controller 122. System 120 is structured to determine line-to-ground voltage on each side of power switch 121, and determine the direction of a ground fault relative to power switch 121 using the line-to-ground voltages. For example, controller 122 may determine a ground fault is located towards the power source within power network 110, or towards the load within power network 130. In some embodiments, system 120 may respond to a ground fault by preventing closing of one of more phase power switches of power switch 121 Power switch 121 includes a source-side and a load-side. The source-side includes source-side terminals, and the load-side includes load-side terminals.

Power switch 121 is structured to receive power from power source 111 at the source-side and selectively output the received power at the load-side. In some embodiments, the power switch 121 can receive power from both the load-side and the source-side. For example, in some embodiments, the load 131 can be configured to include voltage present on the load-side even when disconnected from the power source 111 (i.e., when the power switch 121 is in the off state).

Power switch 121 includes a set of phase power switches 123, 125, and 127, one for each phase. Each phase power switch includes a source-side terminal and a load-side terminal: phase power switch 123 includes source-side terminal 123a and load-side terminal 123b; phase power switch 125 includes source-side terminal 125a and load-side terminal 125b; and phase power switch 127 includes source-side terminal 127a and load-side terminal 127b.

In the illustrated embodiment, the phase power switches include thyristors coupled in an anti-parallel configuration. Power switch 121 may include any type of semiconductor switch such as insulated gate bipolar transistors (IGBTs), bipolar junction transistors (BJTs), metal-oxide-semiconductor field-effect transistors (MOSFETs), gate turn-off thyristors (GTOs), MOS-controlled thyristors (MCTs), integrated gate-commutated thyristors (IGCTs), silicon carbide (SiC) switching devices, gallium nitride (GaN) switching devices, or any other type of switch having an on-state voltage drop.

Voltage measuring devices 128 and 129 are structured to measure voltages on either side of power switch 121. For example, voltage measuring device 128 may be structured to measure a voltage at each source-side terminal and voltage measuring device 129 may be structured to measure a voltage at each load-side terminal.

In the illustrated embodiment, voltage measuring devices 128 and 129 measure line-to-ground voltages for each phase and transmit the voltages to controller 122. In other embodiments, voltage measuring devices 128 and 129 may measure another type of voltage and controller 122 is structured to calculate the line-to-ground voltages using the voltage measurements received from voltage measuring devices 128 and 129. In some embodiments, voltage measuring devices 128 or 129 may include a plurality of voltage measuring devices collectively structured to measure voltages for each phase.

Voltage measuring devices 128 and 129 may be any type of measuring device structured to measure voltage, such as a voltage sensor or a voltage divider, to name but a few examples.

Controller 122 is structured to determine a ground fault is occurring on one of the phases, receive voltage measurements from voltage measuring devices 128 and 129, determine a source-side-to-ground voltage for the faulted phase based on the voltage measurements received from voltage measuring device 128 in response to determining the ground fault is occurring, determine a load-side-to-ground voltage for the faulted phase based on each voltage measurement received from voltage measuring device 129 in response to determining the ground fault is occurring, and determine the direction of the ground fault using the line-ground voltages. In some embodiments, controller 122 is also structured to mitigate the ground fault by keeping open one or more phase power switches, or alerting a user, to name but a few examples.

Controller 122 uses the off-state voltages to determine the ground fault direction. Controller 122 also determines the ground fault direction without the use of current sensors, which in addition to being more complex, are more likely to experience current saturation, are costlier than voltage measuring devices, and become less accurate as the measured current magnitude increases.

In some embodiments, HRG power system 100 may include more than one ground fault protection system. For example, system 100 may include an additional ground fault protection system coupled between ground fault protection system 120 and load 131. In this case, the controllers of each ground fault protection system may communicate determined ground fault directions or voltage measurements in order to further identify the location of the ground fault. For example, the ground fault protection systems would be able to determine if the ground fault was between the ground fault protection systems or between the new ground fault protection system and load 131. The ground fault protection systems may also operate their respective power switches based on their own determined ground fault direction and the ground fault direction received from the other ground fault protection system.

It shall be appreciated that any or all of the foregoing features of power system 100 may also be present in the other power systems disclosed herein. While the embodiments described hereinafter may not specifically describe features analogous to the features of system 100, such features may nonetheless be employed in connection with the described systems.

Figure 2:
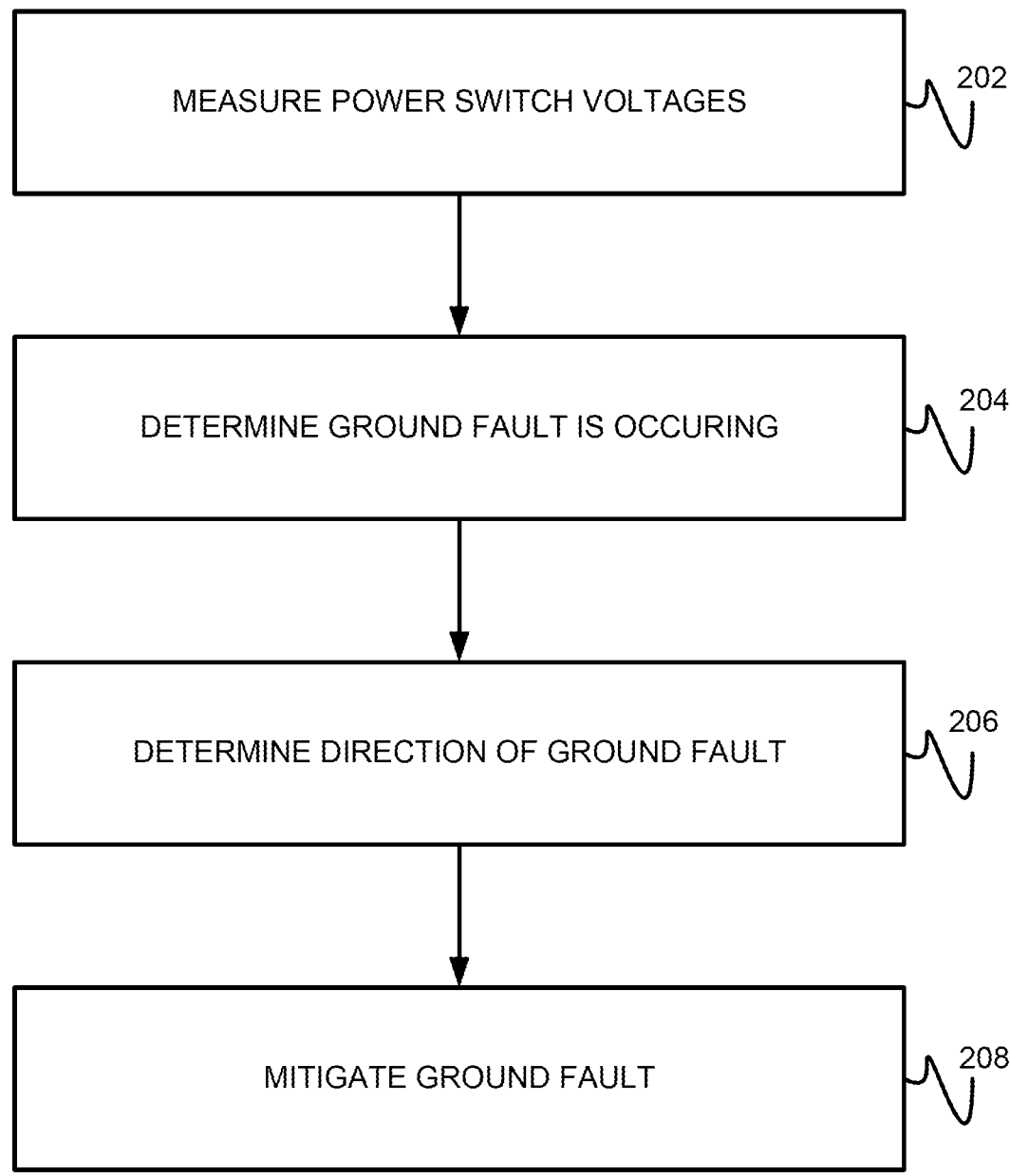
FIG. 2 is a flowchart illustrating an exemplary ground fault protection process.

With reference to FIG. 2, there is illustrated a flowchart for a ground fault protection process 200, according to some embodiments. The following description of process 200 is made with reference to system 100 illustrated in FIG. 1. It is to be understood, however, that process 200 may be used in combination with other forms of power systems, such as those described below with reference to FIG. 3 or FIG. 4. It shall be appreciated that a number of variations and modifications to process 200 are contemplated including, for example, the omission of one or more aspects of process 200, the addition of further conditionals and operations, and/or the reorganization or separation of operations and conditionals into separate processes.

At block 202, voltage measuring devices 128 and 129 measure voltages on each side of power switch 121. Measuring device 128 measures the source-side of power switch 121 while power switch 121 is in an off or opened state. Measuring device 129 measures the load-side of power switch 121 while measuring device 128 measures the source-side of power switch 121. Measuring device 129 measures the load-side of power switch 121 where a voltage is present on the load-side of the power switch 121 even when the power switch 121 is in the opened or off state.

At block 204, controller 122 determines a ground fault is occurring on one phase. Controller 122 may determine the ground fault is occurring by using the line-to-ground voltages as determined and/or other information received by controller 122. For example, controller 122 may receive a voltage measurement corresponding to a voltage difference between a ground and a neutral point of the multiphase power. If the voltage exceeds a threshold, controller 122 determines a ground fault is occurring. In some embodiments, block 204 can include controller 122 determining the line-to-ground voltages for each side of the power switch, the line-to-ground voltage corresponding to voltages of power switch 121 during the ground fault. In some embodiments, voltage measuring devices 128 and 129 are structured to measure the line-to-ground voltage for each terminal, and controller 122 determines the line-to-ground voltage for each terminal by receiving the voltage measurements from voltage measuring devices 128 and 129. In some embodiments, controller 122 determines the line-to-ground voltages by calculating the line-to-ground voltage using the voltages received from measuring devices 128 and 129. For example, controller 122 may receive line-to-neutral voltages from measuring devices 128 and 129, and a separate neutral-ground measurement from another measuring device.

At block 206, controller 122 determines the location of the ground fault relative to power switch 121. That is, the controller 122 determines whether the ground fault is on the source-side of the power switch 121 or the load-side of the power switch 121. At block 208, HRG power system 100 mitigates the ground fault based on the determined switch side of the ground fault. In some embodiments, mitigating the ground fault may include reporting an alarm event or operating the power switch, to name but a few examples. In some embodiments, controller 122 may report the alarm event by transmitting a notification to a human-machine interface (HMI), a supervisory control and data acquisition (SCADA) system, or a battery management system (BMS), to give but a few examples.

In some embodiments, HRG power system 100 may operate the power switch by closing the power switch 121 if there is a single ground fault. That is, in some embodiments, the HRG power system 100 may turn the power switch 121 on even if a ground fault is present.

In some embodiments, HRG power system 100 may operate the power switch by locking the power switch open if there is a single ground fault. In some embodiments, controller 122 determines whether to mitigate the ground fault by operating the power switch based on user-defined parameters or power system requirements.

In some embodiments, controller 122 may be configured to close the power switch 121 once controller 122 determines two ground faults are occurring on the same pole but opposite sides of the switch. In some embodiments, controller 122 may lock open power switch 121 if controller 122 determines the two ground faults are occurring on poles of opposite polarity. Where a power system includes multiple ground fault protection systems, the multiple controllers may coordinate power switch operation based on the determined ground fault directions for each switch. It shall be appreciated that any or all of the foregoing features of process 200 may also be present in the other methods disclosed herein.

Figure 3:
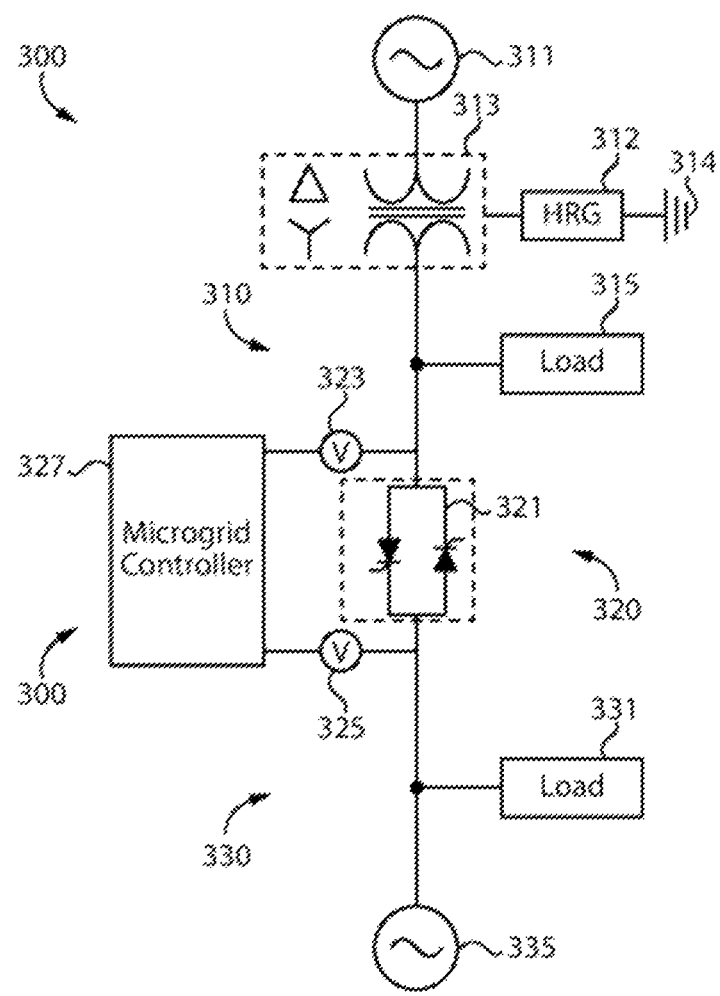
FIG. 3 is a circuit diagram illustrating an exemplary ground fault protection system including a microgrid disconnect switch.

With reference to FIG. 3, there is illustrated an exemplary HRG power system 300 including microgrid 301. It shall be appreciated that the topology of system 300 is illustrated for the purpose of explanation and is not intended as a limitation of the present disclosure. For example, system 300 may include more loads, more power generation systems, or more distributed generation systems, to name but a few examples. Although HRG power system 300 is illustrated with a single line diagram, system 300 may be structured to transmit single-phase power, multiphase power, or DC power.

HRG power system 300 includes a power network 310 including a power generation system 311 coupled to power transformer 313, and a load 315. A high resistance ground resistor 312 is coupled to a neutral point of power transformer 313 and ground 314. Microgrid 301 is coupled to power network 310.

Microgrid 301 includes ground fault protection system 320 and power network 330. Power network 330 includes load 331 and distributed energy resource 335. Microgrid 301 is structured to selectively disconnect from the remaining portion of HRG power system 300 and distribute power independently, also known as islanding. For example, microgrid 301 may island when a ground fault exists on power network 310 such that microgrid 301 is unable to meet system operating parameters or utility requirements.

Ground fault protection system 320 includes microgrid controller 327, voltage measuring devices 323 and 325, and microgrid disconnect switch 321. Microgrid controller 327 is structured to determine phase-to-ground voltages on each side of switch 321 using voltage measuring devices 323 and 325 and determine the direction of the ground fault using the phase-to-ground voltages. In some embodiments, microgrid controller 327 is structured to island microgrid 301 by locking open microgrid disconnect switch 321 in response to determining the ground fault is located outside microgrid 301.

Figure 4:
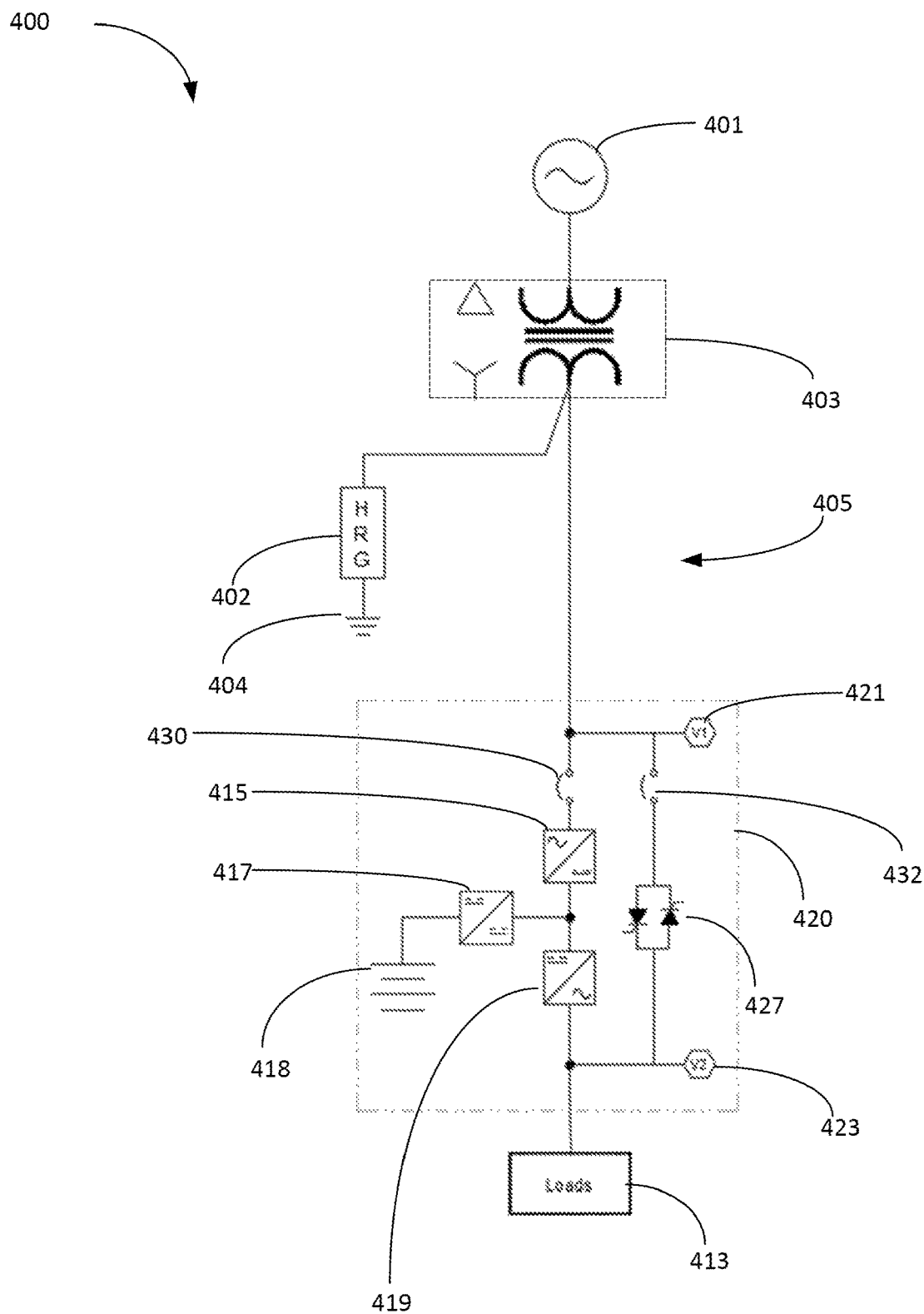
FIG. 4 is a circuit diagram illustrating an exemplary ground fault protection system including an uninterruptible power supply.

With reference to FIG. 4, there is illustrated an exemplary HRG power system 400. It shall be appreciated that the topology of system 400 is illustrated for the purpose of explanation and is not intended as a limitation of the present disclosure. For example, system 400 may include more loads, more power generation systems, or more distributed generation systems, to name but a few examples. Although HRG power system 400 is illustrated with a single line diagram, system 400 may be structured to transmit single-phase power, multiphase power, or DC power.

HRG power system 400 includes power network 405 including a power source 401 coupled to an uninterruptible power supply (UPS) 420 by way of a power transformer 403. Power transformer 403 is coupled to a high resistance grounding resistor 402 that is coupled to ground 404.

The UPS 420 includes voltage measuring devices 421 and 423 and transfer switch 427. The UPS 420 is structured to determine phase-to-ground voltages on each side of transfer switch 427 using voltage measuring devices 421 and 423. As a result, the UPS 420 can determine a direction of the location of a ground fault using the phase-to-ground voltages as measured. The UPS 420 also includes a rectifier 413 configured to receive an alternating current and output a direct current, a converter 417 to convert a direct current to a direct current at a desired voltage, and an inverter 419 configured to convert a direct current to an alternating current for the loads 413. In some embodiments, the converter 417 is configured to output the direct current at a controlled voltage to a storage device 418. In some embodiments, the storage device 418 is a battery.

In some embodiments, transfer switch 427 can be used to determine whether the UPS 420 can transfer to bypass, for example, to improve efficiency, based on whether or not a load-side ground fault is present and, if the load-side fault is present, which phase the load-side fault is located on.

In some embodiments, the UPS 420 also includes breakers 430 and 432. In some embodiments, the UPS 420 includes a controller. In some embodiments, the UPS 420 is configured to disable the bypass when the ground fault based on the direction of the ground fault by locking open the power switch in response to the controller determining two ground faults are occurring on different phases

ASPECTS

Various Aspects are described below. It is to be understood that any one or more of the features recited in the following Aspect(s) can be combined with any one or more other Aspect(s).

Aspect 1. A ground fault protection system, comprising: a power switch including a source-side and a load-side, the power switch being structured to receive a load current from a power source at the source-side and selectively output the load current from the load-side to a load; a first voltage measuring device structured to measure a first voltage of the source-side while the power switch is not conducting the load current; a second voltage measuring device structured to measure a second voltage of the load-side while the power switch is not conducting the load current; and a controller structured to determine a source-side-to-ground voltage based on the first voltage, determine a load-side-to-ground voltage based on the second voltage, determine a ground fault is occurring, and determine a direction of the ground fault relative to the power switch; wherein the controller determines whether to mitigate the ground fault based on the direction of the ground fault by locking open the power switch in response to the controller determining two ground faults are occurring on different phases.

Aspect 2. The ground fault protection system of aspect 1, wherein the ground fault protection system is incorporated into a power system including a high resistance ground resistor.

Aspect 3. The ground fault protection system of one of aspects 1 or 2, wherein the power switch is structured to receive multiphase power at the source-side and output the multiphase power at the load-side.

Aspect 4. The ground fault protection system of aspect 3, wherein the controller determines a ground fault is occurring based on a voltage difference between ground and a neutral point of the multiphase power.

Aspect 5. The ground fault protection system of any one of aspects 1-4, wherein the source-side includes a source-side terminal and the load-side includes a load-side terminal, and wherein the first voltage is measured at the source-side terminal and the second voltage is measured at the load-side terminal.

Aspect 6. The ground fault protection system of any one of aspects 1-5, wherein the power switch is configured to receive multiphase power at the source-side and at the load-side.

Aspect 7. The ground fault protection system of any one of aspects 1-6, wherein the power switch is coupled to a microgrid including the load and a distributed energy resource, and wherein the controller locks open the power switch in response to determining the ground fault direction is towards the power source Aspect 8. The ground fault protection system of any one of aspects 1-7, wherein the controller determines whether to mitigate the ground fault based on the direction of the ground fault by closing the power switch in response to a ground fault not occurring.

Aspect 9. The ground fault protection system of any one of aspects 1-8, wherein the controller determines whether to mitigate the ground fault based on the direction of the ground fault by locking open the power switch in response to a single ground fault occurring.

Aspect 10. The ground fault protection system of any one of aspects 1-9, wherein the controller determines whether to mitigate the ground fault based on the direction of the ground fault by closing the power switch in response to the controller determining two ground faults are occurring on the same phase.

Aspect 11. A ground fault protection method, comprising: measuring a first voltage of a source-side while a power switch is in an off state; measuring a second voltage of a load-side while the power switch is in the off state; determining a ground fault is occurring based on the first voltage and the second voltage; determining a direction of the ground fault relative to the power switch; and determining, by a controller, whether to mitigate the ground fault based on the direction of the ground fault by locking open the power switch in response to the controller determining two ground faults are occurring on different phases.

Aspect 12. The ground fault protection method of aspect 11, wherein the power switch is incorporated into a high resistance ground system.

Aspect 13. The ground fault protection method of one of aspects 11 or 12, wherein the power switch is structured to receive multiphase power at the source-side and output the multiphase power at the load-side.

Aspect 14. The ground fault protection method of aspect 13, wherein determining the ground fault is occurring is based on a voltage difference between ground and a neutral point of the multiphase power.

Aspect 15. The ground fault protection method of any one of aspects 11-14, wherein the source-side includes a source-side terminal and the load-side includes a load-side terminal, and wherein the first voltage is measured at the source-side terminal and the second voltage is measured at the load-side terminal.

Aspect 16. The ground fault protection method of any one of aspects 11-15, determining, by the controller, whether to mitigate the ground fault based on the direction of the ground fault by closing the power switch in response to the controller determining a ground fault is not occurring.

Aspect 17. The ground fault protection method of any one of aspects 11-16, determining, by the controller, whether to mitigate the ground fault based on the direction of the ground fault by locking open the power switch in response to a single ground fault occurring.

Aspect 18. The ground fault protection method of any one of aspects 11-17, determining, by the controller, whether to mitigate the ground fault based on the direction of the ground fault by closing the power switch in response to the controller determining two ground faults are occurring on the same phase.

Aspect 19. The ground fault protection method of any one of aspects 11-18, wherein the power switch is coupled to a microgrid including the load and a distributed energy resource, and wherein the method comprises opening the power switch in response to determining the ground fault direction is towards the power source.

Aspect 20. The ground fault protection method of any one of aspects 11-19, wherein the power switch is configured to receive multiphase power at the source-side and at the load-side.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A ground fault protection system, comprising:
a power switch including a source-side and a load-side, the power switch being structured to receive a load current from a power source at the source-side and selectively output the load current from the load-side to a load;
a first voltage measuring device structured to measure a first voltage of the source-side while the power switch is not conducting the load current;
a second voltage measuring device structured to measure a second voltage of the load-side while the power switch is not conducting the load current; and
a controller structured to determine a source-side-to-ground voltage based on the first voltage, determine a load-side-to-ground voltage based on the second voltage, determine a ground fault is occurring, and determine a direction of the ground fault relative to the power switch;
wherein the controller determines whether to mitigate the ground fault based on the direction of the ground fault by locking open the power switch in response to the controller determining two ground faults are occurring on different phases.

2. The ground fault protection system of claim 1, wherein the ground fault protection system is incorporated into a power system including a high resistance ground resistor.

3. The ground fault protection system of claim 1, wherein the power switch is structured to receive multiphase power at the source-side and output the multiphase power at the load-side.

4. The ground fault protection system of claim 3, wherein the controller determines a ground fault is occurring based on a voltage difference between ground and a neutral point of the multiphase power.

5. The ground fault protection system of claim 1, wherein the source-side includes a source-side terminal and the load-side includes a load-side terminal, and wherein the first voltage is measured at the source-side terminal and the second voltage is measured at the load-side terminal.

6. The ground fault protection system of claim 1, wherein the power switch is configured to receive multiphase power at the source-side and at the load-side.

7. The ground fault protection system of claim 1, wherein the power switch is coupled to a microgrid including the load and a distributed energy resource, and wherein the controller locks open the power switch in response to determining the ground fault direction is towards the power source.

8. The ground fault protection system of claim 1, wherein the controller determines whether to mitigate the ground fault based on the direction of the ground fault by closing the power switch in response to a ground fault not occurring.

9. The ground fault protection system of claim 1, wherein the controller determines whether to mitigate the ground fault based on the direction of the ground fault by locking open the power switch in response to a single ground fault occurring.

10. The ground fault protection system of claim 1, wherein the controller determines whether to mitigate the ground fault based on the direction of the ground fault by closing the power switch in response to the controller determining two ground faults are occurring on the same phase.

11. A ground fault protection method, comprising:
measuring a first voltage of a source-side while a power switch is in an off state;
measuring a second voltage of a load-side while the power switch is in the off state;
determining a ground fault is occurring based on the first voltage and the second voltage;
determining a direction of the ground fault relative to the power switch; and
determining, by a controller, whether to mitigate the ground fault based on the direction of the ground fault by locking open the power switch in response to the controller determining two ground faults are occurring on different phases.

12. The ground fault protection method of claim 11, wherein the power switch is incorporated into a high resistance ground system.

13. The ground fault protection method of claim 11, wherein the power switch is structured to receive multiphase power at the source-side and output the multiphase power at the load-side.

14. The ground fault protection method of claim 13, wherein determining the ground fault is occurring is based on a voltage difference between ground and a neutral point of the multiphase power.

15. The ground fault protection method of claim 11, wherein the source-side includes a source-side terminal and the load-side includes a load-side terminal, and wherein the first voltage is measured at the source-side terminal and the second voltage is measured at the load-side terminal.

16. The ground fault protection method of claim 11, determining, by the controller, whether to mitigate the ground fault based on the direction of the ground fault by closing the power switch in response to the controller determining a ground fault is not occurring.

17. The ground fault protection method of claim 11, determining, by the controller, whether to mitigate the ground fault based on the direction of the ground fault by locking open the power switch in response to a single ground fault occurring.

18. The ground fault protection method of claim 11, determining, by the controller, whether to mitigate the ground fault based on the direction of the ground fault by closing the power switch in response to the controller determining two ground faults are occurring on the same phase.

19. The ground fault protection method of claim 11, wherein the power switch is coupled to a microgrid including the load and a distributed energy resource, and wherein the method comprises opening the power switch in response to determining the ground fault direction is towards the power source.

20. The ground fault protection method of claim 11, wherein the power switch is configured to receive multiphase power at the source-side and at the load-side.

* * * * *